(12) United States Patent
Cagle et al.

(10) Patent No.: US 10,027,366 B2
(45) Date of Patent: Jul. 17, 2018

(54) HIGH POWER RADIO FREQUENCY (RF) ANTENNA SWITCH

(71) Applicant: Raytheon Company, Waltham, MA (US)

(72) Inventors: William L. Cagle, Waltham, MA (US); Toshikazu Tsukii, Waltham, MA (US)

(73) Assignee: Raytheon Company, Waltham, MA (US)

( * ) Notice: Subject to any disclaimer, the term of this patent is extended or adjusted under 35 U.S.C. 154(b) by 782 days.

(21) Appl. No.: 14/262,552

(22) Filed: Apr. 25, 2014

(65) Prior Publication Data

US 2016/0365888 A1    Dec. 15, 2016

(51) Int. Cl.
| | |
|---|---|
| *H04B 1/44* | (2006.01) |
| *H01P 1/12* | (2006.01) |
| *H01P 1/15* | (2006.01) |
| *H01P 5/16* | (2006.01) |
| *H03H 7/46* | (2006.01) |
| *H04L 12/26* | (2006.01) |
| *H04W 52/52* | (2009.01) |

(52) U.S. Cl.
CPC ............. *H04B 1/44* (2013.01); *H01P 1/127* (2013.01); *H01P 1/15* (2013.01); *H01P 5/16* (2013.01); *H03H 7/465* (2013.01); *H04L 43/16* (2013.01); *H04W 52/52* (2013.01)

(58) Field of Classification Search
CPC combination set(s) only.
See application file for complete search history.

(56) References Cited

U.S. PATENT DOCUMENTS

| | | | |
|---|---|---|---|
| 4,726,051 A | 2/1988 | Schuermann | |
| 5,109,205 A | 4/1992 | Hart | |
| 5,625,894 A * | 4/1997 | Jou | H04B 1/52 333/103 |
| 6,434,368 B1 * | 8/2002 | Stadmark | H04B 1/44 455/127.2 |
| 7,453,329 B2 * | 11/2008 | Inoue | H01P 1/22 333/81 A |

(Continued)

FOREIGN PATENT DOCUMENTS

| | | |
|---|---|---|
| EP | 0446050 A | 9/1991 |
| EP | 0723338 A | 7/1996 |

(Continued)

OTHER PUBLICATIONS

PCT Search report for application PCT/US2015/017568 dated May 18, 2015, 129 pages.

*Primary Examiner* — Junpeng Chen

(57) ABSTRACT

A technology is provided for handling signals with defined power levels that are received at an antenna port. The signals can be received at a first antenna port, wherein the first antenna port is coupled to a plurality of PIN diodes positioned in parallel in between one or more transmission lines with a defined impedance. The defined power levels associated with the signals can be determined to exceed a predetermined threshold. The signals with the defined power levels that exceed the predetermined threshold can be redirected to a second antenna port, wherein the second antenna port is coupled to the plurality of PIN diodes positioned in parallel in between the one or more transmission lines with the defined impedance.

21 Claims, 4 Drawing Sheets

(56) References Cited

U.S. PATENT DOCUMENTS

| | | |
|---|---|---|
| 2003/0132814 A1 | 7/2003 | Nyberg |
| 2006/0170516 A1 | 8/2006 | Marion et al. |
| 2007/0126492 A1* | 6/2007 | Pengelly .................. H01P 1/15 |
| | | 327/430 |
| 2007/0216501 A1 | 9/2007 | Tsai et al. |
| 2010/0097119 A1* | 4/2010 | Ma ........................... H01P 1/15 |
| | | 327/427 |
| 2010/0097120 A1* | 4/2010 | Bizien ....................... H01P 1/15 |
| | | 327/493 |
| 2010/0244985 A1* | 9/2010 | Chang ....................... H01P 1/15 |
| | | 333/175 |
| 2014/0120968 A1* | 5/2014 | Mahmood ................ H01P 1/15 |
| | | 455/501 |

FOREIGN PATENT DOCUMENTS

| | | |
|---|---|---|
| EP | 1237222 A1 | 9/2002 |
| WO | WO 98/37640 A1 | 8/1998 |

* cited by examiner

HIGH POWER RADIO FREQUENCY (RF) ANTENNA SWITCH

GOVERNMENT LICENSE RIGHTS

This invention was made with government support under Contract No. N00024-13-C-5403 awarded by the Navy. The government has certain rights in the invention.

BACKGROUND

Communication systems that transmit and receive communication signals are included in a large number of systems, such as missile systems, radar systems, self-propelled guided weapon systems, etc. For example, communication systems can be included in missiles that are launched from a surface (e.g., ground level or sea level) or from above the surface (e.g., from the air). The communication systems can include a number of components (e.g., receivers, surface radar components) that are sensitive to high power signals. The high power signals can have a defined power level that is above a predetermined acceptable threshold. The exposure to the high power signals can damage the components, thereby impairing functionality of the communication system.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1:
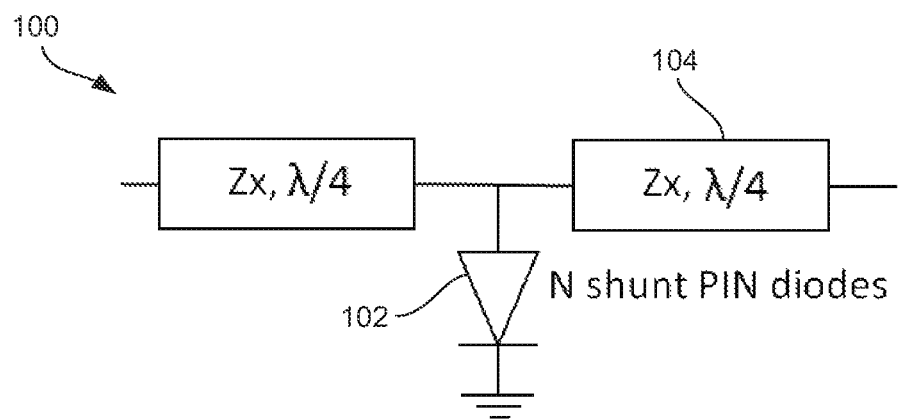
FIG. 1 is an example illustration of a section of a radio frequency (RF) antenna switch in accordance with an embodiment of the present invention.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Communication systems that receive and transmit communication signals can include a number of components that are sensitive to high power signals. The term "high power signals" generally refer to signals that have defined power levels that exceed a predetermined threshold. In one example, the predetermined threshold can be on the order of several hundred watts of power. The communication systems can be included in numerous types of systems, such as missile systems, ground and shipboard radar systems, etc. Thermal buildup from the high power signals can damage the components (e.g., missile components, surface radar components), thereby preventing communication by the communication system.

Although communication systems can be found in a number of devices and systems, those found in a missile or other similar system are discussed herein, but are intended to be exemplary. In one specific example, the missile or the self-propelled guided weapon (that includes the communication system) can be launched from over the water or in the air, such as from a ship or an aircraft, respectively. The missile can be launched in front of a ground radar system (or other types of ground communication systems). The radar system can be tracking and/or communicating with targets in the field.

The missile can fly in front of a high power antenna (such as one that is included in the radar system) and if the high power antenna is pointed towards the missile and transmitting high power signals to targets in the field, the high power signals can impair the functionality of various components included in the communication system. In other words, the components included in the communication system may be unable to function when exposed to the high power signals transmitted from the ground radar system. Therefore, the communication components (e.g., receivers) can be damaged during what may be termed a "fly through period"—or a period after the missile is launched when the communication components are exposed to one or more high power signals and are susceptible to getting damaged from ground-level radar systems.

In another example, the communication components can be damaged within a hostile radio frequency (RF) environment. During the hostile RF environment, the communication system can be unceremoniously hit with high power signals from a hostile party. The high power signals can damage the receiver (or other communication components), so that the communication system is unable to communicate as needed or intended (e.g., such as with an entity that launched the missile, self-propelled guided weapon, etc.). In yet another example, the communication components can be damaged when flying close to an airport or weather radar or a civilian plane flying close to military search radar. In addition, the communication components may be damaged when flying between RF communication links or close to a commercial broadcast tower.

Disclosed herein are systems and methods that improve power handling by spreading or distributing thermal energy (i.e., heat) from the high power signals among a plurality of devices while maintaining performance at a certain frequency. In one example, the plurality of devices includes a plurality of PIN diodes (or shunt PIN diodes) that are arranged in parallel. In general PIN diodes act as a current variable impedance and can be used to design high power RF switches. The power handling capability can be limited by the PIN diodes. A minimal amount of insertion loss (i.e., the loss of signal power resulting from the insertion of a device in a transmission line) can result in a large power dissipation at high RF levels.

In previous solutions, up to two PIN diodes were used to handle the power levels of signals. However, increased power levels in recent years have resulted in the previous solutions being inadequate. As such, disclosed herein are systems and methods that improve power handling by creating an RF antenna switch with multiple PIN diodes in parallel in between transmission lines with an impedance that is set based on the multiple PIN diodes, thereby spreading or distributing the power/heat dissipation from the signals, while maintaining a desired voltage standing wave ratio (VSWR) match at a required frequency. In addition, high incident power (i.e., signals with defined signal powers that exceed the predetermined threshold) can be reflected out of an opposite antenna port in order to protect other components within the communication system.

FIG. 1 is an example illustration of a section of a radio frequency (RF) antenna switch 100. The antenna switch 100 can be a single pole double throw (SPDT) switch. The antenna switch 100 can include N shunt PIN diodes 102, wherein N is an integer and the N shunt PIN diodes are arranged in parallel. The antenna switch 100 includes a transmission line 104. In one example, the transmission line 104 is a quarter-wave impedance transformer (often written as $\lambda/4$ impedance transformer). The transmission line 104 may transport high power signals received at one or more antennas to a front-end receiver (not shown in FIG. 1). The thermal heat from the high power signals may damage components in the antenna switch 100. The N shunt PIN diodes 102 may improve the thermal handling of the antenna switch 100 by spreading the heat among the N shunt PIN diodes 102. In addition, a line width of the transmission lines 104 may increase as the N shunt PIN does 102 increase. An increased line width may support a plurality of parallel blocking capacitors (not shown in FIG. 1) to further spread the power and dissipate heat from the how power signals. The power handling is increased by a factor of N (which corresponds to the N shunt PIN diodes 102) as compared to using a single shunt PIN diode. Another advantage to increasing the N shunt PIN diodes is that the matching transmission line width increases, which can further improve the spreading of heat.

Figure 2:
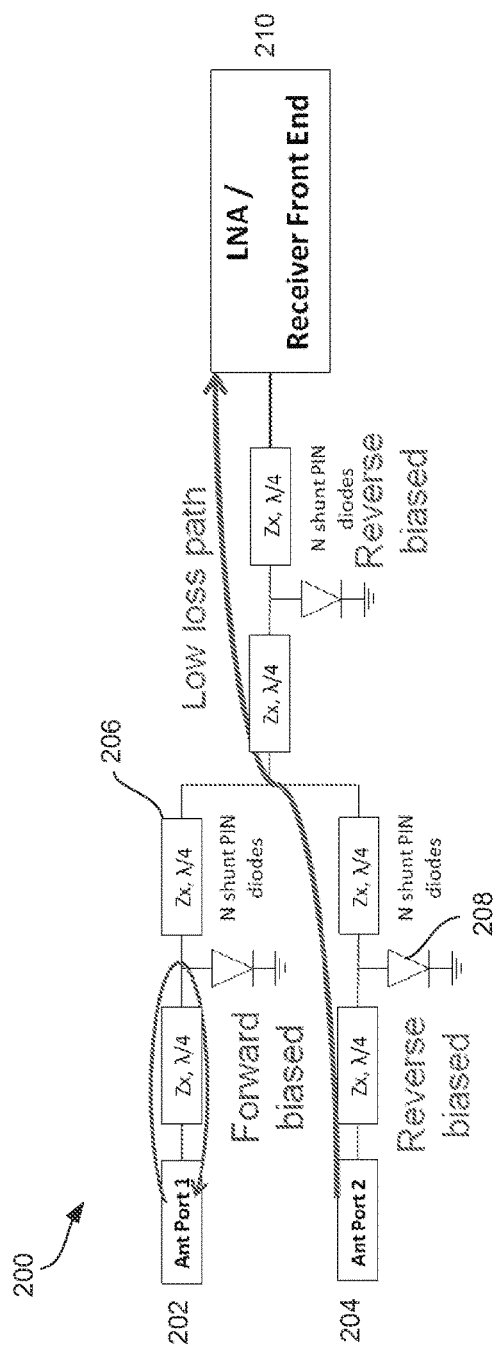
FIG. 2 is an example illustration of a radio frequency (RF) antenna switch with a low loss signal path between an antenna port and a front-end receiver in accordance with an embodiment of the present invention.

FIG. 2 is an example illustration of a low loss signal path in a system 200. The system 200 can be included in a communication system for receiving and transmitting signals, such as communication signals. The system 200 can be included in a radar system, a missile system, or various types of self-propelled guided weapon systems. The system 200 can include a first antenna port 202 (Ant Port 1) and a second antenna port 204 (Ant Port 2). The system 200 can also be known as having a Y-configuration.

The system 200 is a 2×1 (2 by 1) type of radio frequency (RF) antenna switch. The RF antenna switch can also be known as a single pole double throw (SPDT) switch. In other words, there are two inputs (corresponding to the first antenna port 202 and the second antenna port 204) and one output (corresponding to a front-end receiver 210). The RF antenna switch can route the communication signals through a variety of transmission paths (e.g., from the second antenna port 204 to the front-end receiver 210). The first antenna port 202 or the second antenna port 204 is activated to receive the communication signals at a given time.

The first antenna port 202 or the second antenna port 204 can receive the communication signals from a source. The communication signals can include, but are not limited to, global positioning system (GPS) signals, radar signals, etc. (target data, ship communications, navigation and hostile jammers) The communication signals received at either the first antenna port 202 or the second antenna port 204 have a maximum defined power handling level (in watts). When the defined power level is above a predetermined threshold, the communication signals can be classified as "high power signals," which power level can be measured or determined as will be appreciated by one of ordinary skill in the art.

The system 200 can include a plurality of PIN diodes 208 (or shunt PIN diodes) that are positioned in parallel between transmission lines 206. In one example, the communication signals received at the first antenna port 202 or the second antenna port 204 can pass the plurality of shunt PIN diodes 208 into the front-end receiver 210 (or receiver front end). The front-end receiver 210 can use the communication signals (e.g., GPS signals, radar signals) to determine a location of the system 200. In one example, the front-end receiver 200 may include a low noise amplifier (LNA) to amplify the communication signals that pass the plurality of shunt PIN diodes 208.

As shown in FIG. 2, communication signals that are received at the second antenna port 204 can pass the shunt PIN diodes 208 into the front-end receiver 210 when the PIN diodes 208 are reverse biased. The path taken by the communication signals when the shunt PIN diodes 208 are reversed biased is known as a desired path. When the communication signals travel through the desired path, the shunt PIN diodes 208 in an opposite leg of the RF antenna switch are forward biased. In other words, the SPDT switch cannot function when the shunt PIN diodes 208 in the opposite leg are not forward biased. Thus, the PIN diodes 208 act as a high impedance when reverse biased, so that the communication signals are passed through the transmission lines 206 into the front-end receiver 210.

In another example, the communication signals that are received at the first antenna port 202 can be reverted back out of the first antenna port 202 when the PIN diodes 208 are forward biased. In other words, the PIN diodes 208 act as a dead short in a circuit when forward biased, thereby making the PIN diodes 208 into an isolation port or an off port. Thus, the communication signals are not passed through the transmission lines 206 into the front-end receiver 210. Rather, the communication signals are reverted back out of the first antenna port 202.

In one example, the system 200 can include the plurality of PIN diodes 208 positioned in parallel between the transmission lines 206 in order to spread or distribute the power and/or thermal energy (i.e., heat) dissipation from the communication signals received at the first antenna port 202 and the second antenna port 204. The system 200 can include multiple groups of PIN diodes 208 arranged in parallel (as shown in FIG. 2) to spread or distribute the heat from the communication signals. In general, the PIN diodes have a wide, lightly doped intrinsic semiconductor region between a p-type semiconductor and an n-type semiconductor region. The wide intrinsic region, in contrast to an ordinary PN diode, makes the PIN diode suitable for RF switches. When RF power from the communication signal is applied to the PIN diodes 208, heat is primarily generated by the dissipation of power in the diode junction as it absorbs a small portion of the incident RF power and converts it to heat. Therefore, increasing the number of PIN diodes 208 can improve power handling of the signals that are received at the system 200.

In one example, the transmission line 206 is a quarter-wave impedance transformer (often written as λ/4 impedance transformer). The quarter-wave impedance transformer is a length of transmission line 206 or waveguide that is exactly one-quarter of a wavelength (λ) long (at the required frequency) and with a known intrinsic impedance (Zx). The impedance of the transmission line 206 is generally defined as the ratio of the amplitudes of voltage and current of a single wave propagating along the transmission line 206, or in other words, a wave travelling in one direction in the absence of reflections in the other direction. The impedance is expressed in ohms (Ω). Thus, the quarter-wave impedance transformer is a pre-determined length and the line width is designed to produce the required impedance.

As shown in FIG. 2, the first antenna port 202 can be coupled to a first pair of quarter wavelength transmission lines 206, wherein N PIN diodes 208 (or N shunt PIN diodes) are positioned in parallel between the first pair of quarter wavelength transmission lines 206. N is a predefined integer indicating the number of PIN diodes 208. The second antenna port 204 can be coupled to a second pair of quarter wavelength transmission lines 206, wherein the N PIN diodes are positioned in parallel between the second pair of quarter wavelength transmission lines 206. The first pair of quarter wavelength transmission lines 206 and the second pair of quarter wavelength transmission lines 206 can be coupled to a third pair of quarter wavelength transmission lines 206, wherein the N shunt PIN diodes are positioned in parallel between the third pair of quarter wavelength transmission lines. Communication signals received at the first antenna port 202 can pass through the first pair of quarter wavelength transmission lines 206 and the third pair of quarter wavelength transmission lines 206 in order to reach the front-end receiver 210. On the other hand, communication signals received at the second antenna port 204 can pass through the second pair of quarter wavelength transmission lines 206 and the third pair of quarter wavelength transmission lines 206 in order to reach the front-end receiver 210.

In an alternative configuration, the first antenna port 202 can be coupled to the plurality of PIN diodes 208 that are positioned in parallel in between one or more transmission lines 206 with a defined impedance (Zx). The second antenna port 204 can be coupled to the plurality of PIN diodes 208 that are positioned in parallel in between the one or more transmission lines 206 with the defined impedance (Zx). The front-end receiver 210 can receive the signals from either the first antenna port 202 or the second antenna port 204 via the plurality of PIN diodes 208.

As shown in the table below, the N shunt PIN diodes 208 (also known as the plurality of shunt PIN diodes or PIN diodes) can affect: (1) an impedance load associated with the N shunt PIN diodes 208 (in Ω); (2) the impedance of the transmission lines 206; (3) a normalized power handling; and (4) a line width associated with the transmission lines 206.

| Number of Shunt PIN Diodes | Load (in ohms) | Impedance (in ohms) | Normalized Power Handling (in watts) | 50 Ω line width on 20 mil Alumina (in mils) |
|---|---|---|---|---|
| 1 | 50 | 50 | 1 | 19 |
| 2 | 25 | 35.4 | X2 | 36.4 |

-continued

| Number of Shunt PIN Diodes | Load (in ohms) | Impedance (in ohms) | Normalized Power Handling (in watts) | 50 Ω line width on 20 mil Alumina (in mils) |
|---|---|---|---|---|
| 3 | 16.7 | 28.9 | X3 | 50.5 |
| N | 50/N | 50/√N | xN | |

As shown in the table, the load impedance associated with a single shunt PIN diode is 50 Ω and the impedance (Zx) of the transmission line 206 is 50Ω. When N=2, the impedance load associated with the two shunt PIN diodes is 25Ω and the impedance of the transmission line 206 is 35.4Ω. In other words, one shunt PIN diode is matched with 50Ω and two shunt PIN diodes are matched with 25Ω. When N=3, the impedance load associated with the three shunt PIN diodes is 16.7Ω and the impedance of the transmission line 206 is 28.9Ω. In general, the impedance load associated with the N shunt PIN diodes 208 is 50/NΩ and the impedance of the transmission line 206 is 50/√NΩ. In other words, the impedance of the transmission lines 206 (also known as a quarter wavelength impedance value) is calculated according to or based upon the number of shunt PIN diodes. The impedance of the transmission lines 206 is set to the calculated quarter wavelength impedance value. Thus, the relationship between the number of shunt PIN diodes and the matching impedance line is 50/√N. The N shunt PIN diodes are matched with the impedance of the transmission lines 206 in order to minimize reflections from the impedance load. In addition, a favorable voltage standing wave ratio (VSWR) match is maintained at a required frequency. By paralleling the N shunt PIN diodes 208 by an impedance transformation, power and heat dissipation from the signals can be efficiently spread across the N shunt PIN diodes 208, thereby protecting the internal communication components (e.g., receivers) from the power levels associated with the signals. Another advantage to increasing the N shunt PIN diodes is that the matching transmission line width increases, which can further improve the spreading of heat. Therefore, power handling by the antenna switch is increased by a factor of N, without significantly degrading RF performance, by following the design methodology of impedance matching with respect to. the number of PIN diodes (N).

The N shunt PIN diodes 208 can be configured to accommodate or manage the defined power levels associated with the signals. In other words, the N shunt PIN diodes 208 can spread the power and heat dissipation from the signals. The amount of power that can be handled or managed can depend on the number of shunt PIN diodes, as each shunt PIN diode is capable of handling a certain amount of power. In one example, a single shunt PIN diode can handle one watt of power. In other words, the single shunt PIN diode can adequately spread the power and heat dissipation from the one-watt signal, such that the one-watt signal does not damage the components within the communication system. In addition, two shunt PIN diodes can handle two watts of power, three shunt PIN diodes can handle three watts of power, and N shunt PIN diode can handle N watts of power. Therefore, in order to handle signals having ten watts of power, at least ten shunt PIN diodes are positioned in parallel between the transmission lines 206. In addition, the ten shunt PIN diodes can handle signals having up to ten watts of power (i.e., signals having power levels in the range of substantially zero watts to ten watts).

The line width associated with the transmission lines 206 can vary depending on the number of shunt PIN diodes 208. For example, a 50Ω transmission line width on 20 mils of aluminum oxide (alumina) can vary depending on the number of shunt PIN diodes 208. The line width of the transmission line 206 is 19 mils for a single shunt PIN diode, 36.4 mils for two shunt PIN diodes, and 50.5 mils for three shunt PIN diodes. Thus, the line width of the transmission lines 206 corresponds with the number of shunt PIN diodes. In particular, the line width of the transmission lines 206 increases when the number of shunt PIN diodes 208 in parallel also increases. The line width of the transmission lines 206 can support a plurality of parallel blocking capacitors (not shown in FIG. 2) to spread power and dissipate heat from the signals. As the line width increases when the number of shunt PIN diodes 208 increases, an increased number of parallel blocking capacitors can spread the heat from the signals and lower insertion loss, thereby improving the overall power handling capability of the system.

Figure 3:
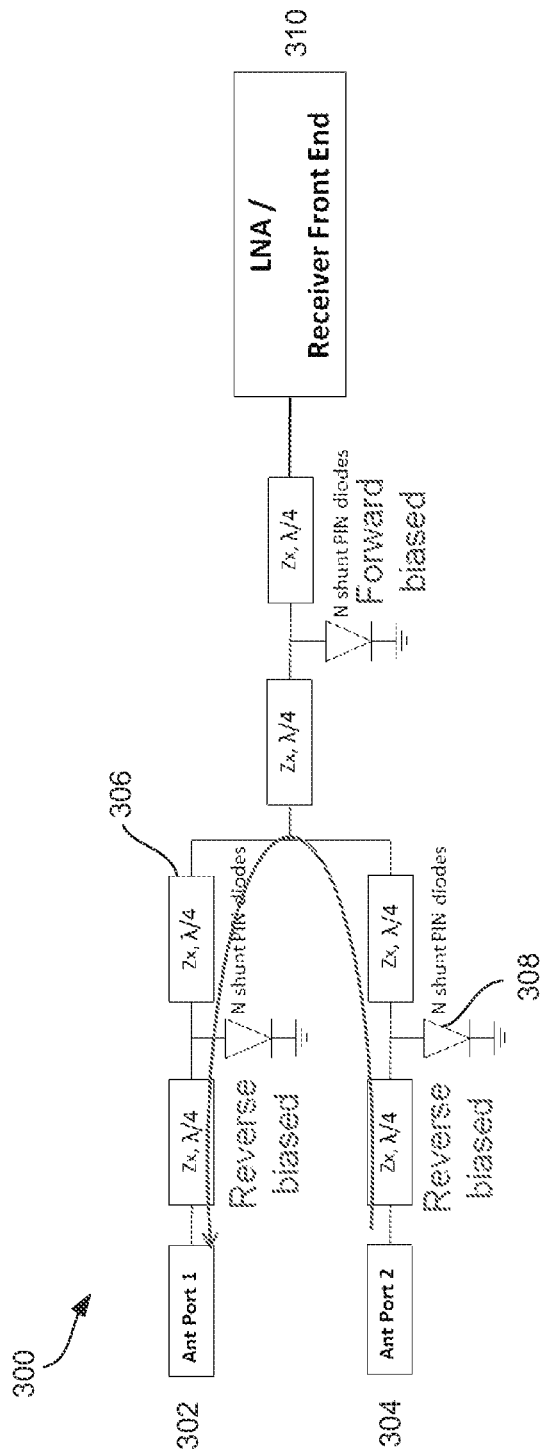
FIG. 3 is an example illustration of a radio frequency (RF) antenna switch with a signal path between a first antenna port and a second antenna port in accordance with an embodiment of the present invention.

FIG. 3 is an example illustration of a signal path between a first antenna port 302 (Ant Port 1) and a second antenna port 304 (Ant Port 2) in a system 300. The system 300 can be included in a communication system for receiving and transmitting signals (e.g., communication signals). The system 300 can be included in a radar system, a missile system, or other types of self-propelled guided weapon systems. The system 300 is a 2×1 (2 by 1) type of RF antenna switch that can route the signals between a variety of transmission paths, such as between the first antenna port 302 and the second antenna port 304. A front-end receiver 310 (also be known as a receiver front end) can include a low noise amplifier (LNA). The first antenna port 302 or the second antenna port 304 can receive signals that have a defined power level (in watts). The system 300 can include a plurality of PIN diodes 308 (or shunt PIN diodes) that are positioned in parallel between transmission lines 306.

304302In the configuration shown in FIG. 3 (also known as a Y-configuration), known high power signals may be injected into an antenna front end, such as the second antenna port 304. In one example, the known high power signals may be received at the second antenna port 304 for a few seconds after a missile is launched from a ship. Therefore, the antenna switch can be configured to transmit the high power, undesired signal out of the opposite antenna port (e.g., the first antenna port 302) in lieu of absorbing the RF signal and the high amount of thermal heat associated with the high power signal. In other words, power handling may be increased at the antenna switch by increasing a number of parallel PIN diodes 308 with a specific relationship on line impedance to maintain a certain radio frequency (RF) voltage standing wave ratio (VSWR). As a result, internal communication components (such as the front-end receiver 310) can avoid exposure to the high power signals. In one example, the known high power signal can be on the order of several hundred watts of power. Thus, high incident power can be redirected out of an opposite leg of a single pole double throw (SPDT) antenna switch, wherein the SPDT antenna switch is capable of directing the signal from the second antenna port 304 to either the first antenna port 302 or the front-end receiver 310.

The high power signals are reflected out of an opposite antenna port, as opposed to the same antenna port that receives the signal, in order to avoid damage to the transmitting source (for the ship based launch example—the ship's phased array antenna). The high power signals can be directed out of the opposite antenna port when the N shunt PIN diodes 306 are reverse biased. In other words, the high power signals being directed out of the opposite antenna port may be known as the desired path. When the communication signals travel through the desired path, the shunt PIN diodes 306 in an opposite leg of the RF antenna switch are forward biased. 308310

As previously discussed, the impedance of the transmission lines 306 can be calculated based on the number of shunt PIN diodes 306. The impedance of the transmission lines 306 can be set to $50/\sqrt{N}\Omega$, wherein N is the number of shunt PIN diodes 308. In addition, the plurality of shunt PIN diodes 308 and parallel blocking capacitors (not shown in FIG. 3) can spread the power and/or heat dissipation from the signals as the signals travel from the second antenna port 304 to the first antenna port 302. Thus, the high power signals are less likely to damage internal communication components when redirected out of the first antenna port 302.

Figure 4:
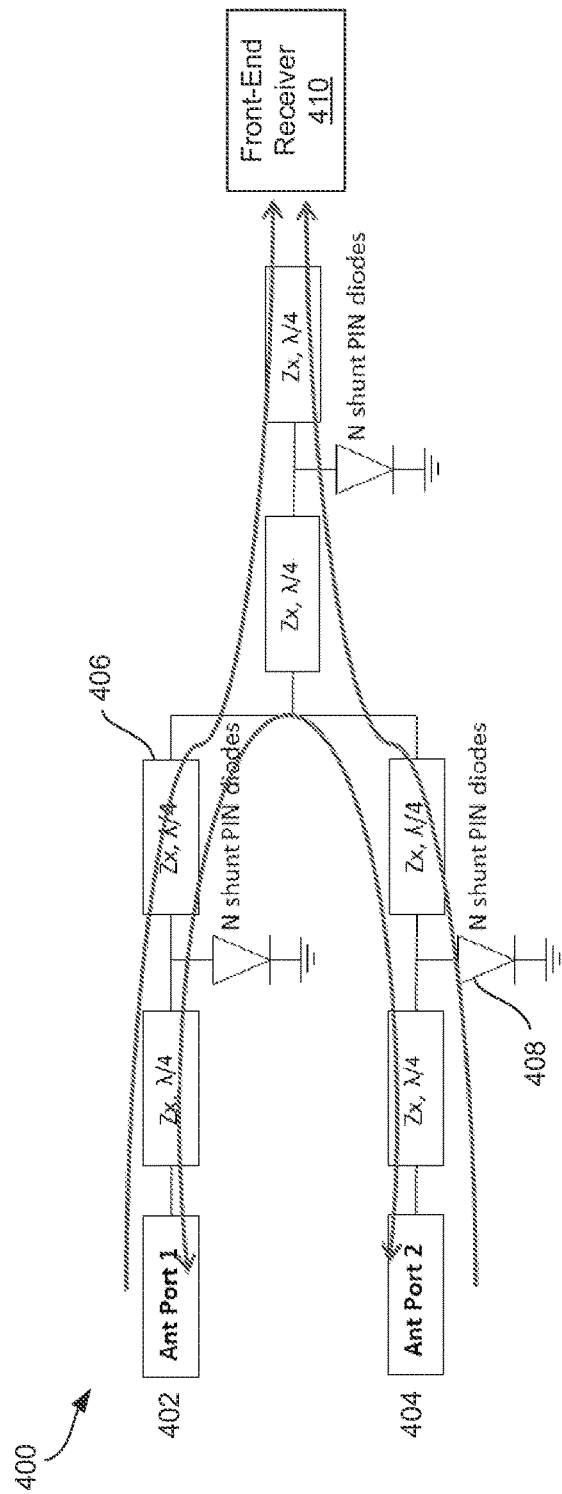
FIG. 4 is an example illustration of a radio frequency (RF) antenna switch with a plurality of signal paths between a first antenna port, a second antenna port and a front-end receiver in accordance with an embodiment of the present invention.

FIG. 4 is an example illustration of a plurality of signal paths between a first antenna port 402, a second antenna port 404 and a front-end receiver 20410 in a system 400. The system 400 can include a plurality of PIN diodes 408 (or shunt PIN diodes) that are positioned in parallel between transmission lines 406. The system 400 is a 2×1 (2 by 1) type of RF antenna switch that can route the signals between a variety of transmission paths, such as between the first antenna port 402 and the second antenna port 404, the first antenna port 402 and the front-end receiver 20410 and/or the second antenna port 404 and the front-end receiver 20410.

The first antenna port 402 and the second antenna port 402 can receive signals having a defined power level. Signals received at the first antenna port 402 can pass through the PIN diode network 408 to the front-end receiver 20410 when the power levels associated with the signals are known to be low power signals. In other words, the low power signals are known to be below a predetermined threshold. In one example, the predetermined threshold can be on the order of several hundred watts of power. In addition, signals received at the second antenna port 404 can pass through the PIN diode network 408 to the front-end receiver 20410 when the power levels associated with the signals are known to be low power signals. Therefore, the antenna switch can be configured to transmit known high power signals (i.e., undesired signals) out of an opposite antenna port in lieu of absorbing the RF signal and the high amount of thermal heat associated with the high power signal. Alternatively, the signals received at the first antenna 402 or second antenna port 404 can be redirected out of the second antenna port 404 or the first antenna port 402, respectively, when the power levels associated with the signals are known to be high power signals (i.e., the signals are known to be above the predetermined threshold).

In accordance with one embodiment of the present invention, a method for handling signals with defined power levels that are received at an antenna port is disclosed. The method can comprise receiving the signals at a first antenna port, wherein the first antenna port is coupled to a plurality of PIN diodes positioned in parallel in between one or more transmission lines with a defined impedance. The method can also comprise determining that the defined power levels associated with the signals exceed a predetermined threshold. The method can further comprise redirecting the signals with the defined power levels that exceed the predetermined threshold to a second antenna port, wherein the second antenna port is coupled to the plurality of PIN diodes positioned in parallel in between the one or more transmission lines with the defined impedance.

In one example, the method further comprises redirecting the signals to the second antenna port when the plurality of PIN diodes are reverse biased. In addition, the method further comprises directing the signals to a front-end receiver when the defined power levels associated with the signals do not exceed the predetermined threshold. Furthermore, the method can comprise setting the defined impedance associated with the one or more transmission lines to $50/\sqrt{N}$, wherein N is the plurality of PIN diodes.

Various techniques, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, EPROM, flash drive, optical drive, magnetic hard drive, or other medium for storing electronic data. The base station and mobile station may also include a transceiver module, a counter module, a processing module, and/or a clock module or timer module. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

It should be understood that many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" means that a particular feature, structure, or characteristic described in connection with the example is included in at least one embodiment of the present invention. Thus, appearances of the phrases "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A system for managing signals with defined power levels that are received at an antenna port, the system comprising:
   a first antenna port directly coupled to a first antenna, the first antenna port configured to receive the signals via the first antenna with the defined power levels, wherein the first antenna port is coupled to a first pair of quarter wavelength transmission lines with an impedance of Zx;
   N shunt PIN diodes positioned in parallel between the first pair of quarter wavelength transmission lines, wherein N is a predefined integer greater than one;
   a second antenna port directly coupled to a second antenna, the second antenna port configured to receive the signals via the second antenna with the defined power levels, wherein the second antenna port is coupled to a second pair of quarter wavelength transmission lines with the impedance of Zx;

N shunt PIN diodes positioned in parallel between the second pair of quarter wavelength transmission lines, wherein N is a predefined integer greater than one; and
a front-end receiver configured to receive the signals from one of the first antenna port or the second antenna port,
wherein the impedance of Zx associated with the first pair of quarter wavelength transmission lines and the second pair of quarter wavelength transmission lines is set based on the N shunt PIN diodes,
wherein the signals that are received at the first antenna port or the second antenna port are redirected to an opposite antenna port when the defined power levels associated with the signals exceed the predetermined threshold.

2. The system of claim 1, wherein the N shunt PIN diodes are positioned in parallel and function to distribute thermal energy generated from the signals received at the first antenna port and the second antenna port.

3. The system of claim 1, further comprising a third pair of quarter wavelength transmission lines with the impedance of Zx coupled to the first pair of quarter wavelength transmission lines and the second pair of quarter wavelength transmission lines, wherein the N shunt PIN diodes are positioned in parallel between the third pair of quarter wavelength transmission lines.

4. The system of claim 1, wherein the impedance of Zx is set to 50/IN, wherein N is the predefined integer indicating a number of shunt PIN diodes.

5. The system of claim 4, wherein the signals having the defined power levels that exceed the predetermined threshold are redirected to the opposite antenna port when the N shunt PIN diodes are reverse biased.

6. The system of claim 1, wherein the front-end receiver includes a low noise amplifier to amplify the signals that are received from the first antenna port or the second antenna port.

7. The system of claim 6, wherein the front-end receiver receives the signals from the first antenna port or the second antenna port when the N shunt PIN diodes are reverse biased.

8. The system of claim 1, wherein a transmission line intrinsic impedance associated with the N shunt PIN diodes is calculated from $50/\sqrt{N}$, wherein N is the predefined integer.

9. The system of claim 1, wherein the N shunt PIN diodes can manage the increase in power handling by up to N times, wherein N is the predefined integer.

10. The system of claim 1, wherein the first antenna port and the second antenna port are included in a missile system or a radar system.

11. The system of claim 1, wherein a line width associated with the first pair of quarter wavelength transmission lines, the second pair of quarter wavelength transmission lines, and the third pair of quarter wavelength transmission lines corresponds to the N shunt PIN diodes.

12. The system of claim 11, wherein the line width supports a plurality of parallel blocking capacitors to spread power and dissipate heat from the signals.

13. A system for managing signals with defined power levels that are received at an antenna port, the system comprising:
a first antenna port configured to receive the signals via a first antenna, wherein the first antenna port is coupled to a plurality of PIN diodes that are positioned in parallel between one or more transmission lines with a defined impedance;
a second antenna port configured to receive the signals via a second antenna, wherein the second antenna port is coupled to the plurality of PIN diodes that are positioned in parallel between the one or more transmission lines with the defined impedance; and
a front-end receiver configured to receive the signals from one of the first antenna port or the second antenna port when the defined power levels associated with the signals are less than a predetermined threshold,
wherein the defined impedance associated with the one or more transmission lines is set based on the plurality of PIN diodes,
wherein at least one of the first antenna port or the second antenna port is further configured to redirect the signals to an opposite antenna port when the defined power levels associated with the signals exceed the predetermined threshold.

14. The system of claim 13, wherein the signals are redirected to the opposite antenna port when the plurality of PIN diodes are reverse biased.

15. The system of claim 13, wherein the defined impedance associated with the one or more transmission lines is set to $50/\sqrt{N}$, wherein N is the plurality of PIN diodes.

16. The system of claim 13, wherein the one or more transmission lines are quarter wavelength transmission lines.

17. The system of claim 13, wherein a line width associated with the one or more transmission lines increases as the number of PIN diodes increases, wherein the line width supports a plurality of parallel blocking capacitors to dissipate heat from the signals.

18. A method for managing signals with defined power levels that are received at an antenna port, the method comprising:
receiving the signals at a first antenna port via a first antenna, wherein the first antenna port is coupled to a plurality of PIN diodes positioned in parallel between one or more transmission lines with a defined impedance;
determining that the defined power levels associated with the signals exceed a predetermined threshold; and
redirecting the signals with the defined power levels that exceed the predetermined threshold from the first antenna port to a second antenna port, wherein the second antenna port is directly coupled to a second antenna and is coupled to the plurality of PIN diodes positioned in parallel between the one or more transmission lines with the defined impedance.

19. The method of claim 18, further comprising redirecting the signals to the second antenna port when the plurality of PIN diodes are reverse biased.

20. The method of claim 18, further comprising directing the signals to a front-end receiver when the defined power levels associated with the signals do not exceed the predetermined threshold.

21. The method of claim 18, further comprising setting the defined impedance associated with the one or more transmission lines to $50/\sqrt{N}$, wherein N is the plurality of PIN diodes.

* * * * *